(12) United States Patent
Nakagawa

(10) Patent No.: US 9,093,638 B2
(45) Date of Patent: Jul. 28, 2015

(54) VIBRATING ELEMENT, SENSOR UNIT AND ELECTRONIC APPARATUS

(71) Applicant: Seiko Epson Corporation, Tokyo (JP)

(72) Inventor: Keiji Nakagawa, Kamiina-gun (JP)

(73) Assignee: Seiko Epson Corporation (JP)

( * ) Notice: Subject to any disclaimer, the term of this patent is extended or adjusted under 35 U.S.C. 154(b) by 309 days.

(21) Appl. No.: 13/847,708

(22) Filed: Mar. 20, 2013

(65) Prior Publication Data

US 2013/0285508 A1    Oct. 31, 2013

(30) Foreign Application Priority Data

Mar. 29, 2012    (JP) ................. 2012-076470

(51) Int. Cl.
*H01L 41/107* (2006.01)
*G01C 19/5607* (2012.01)

(52) U.S. Cl.
CPC .......... *H01L 41/107* (2013.01); *G01C 19/5607* (2013.01)

(58) Field of Classification Search
CPC .................................................. G01C 19/5607
USPC .................. 310/338, 370; 73/504.04, 504.12, 73/504.16
See application file for complete search history.

(56) References Cited

U.S. PATENT DOCUMENTS

| | | | | |
|---|---|---|---|---|
| 5,476,008 A | * | 12/1995 | Pinson ........................ | 73/504.16 |
| 2004/0145281 A1 | * | 7/2004 | Kikuchi et al. ............... | 310/367 |
| 2010/0037692 A1 | * | 2/2010 | Dube et al. .................. | 73/504.16 |
| 2012/0126664 A1 | | 5/2012 | Ogura et al. | |
| 2013/0036819 A1 | * | 2/2013 | Ichikawa et al. ........... | 73/504.12 |

FOREIGN PATENT DOCUMENTS

| | | |
|---|---|---|
| JP | 61191916 A | 8/1986 |
| JP | 05256723 A | 10/1993 |
| JP | 2008209215 A | 9/2008 |
| JP | 2010032482 A | 2/2010 |
| JP | 2012112748 A | 6/2012 |

* cited by examiner

*Primary Examiner* — J. San Martin
(74) *Attorney, Agent, or Firm* — Harness, Dickey & Pierce, P.L.C.

(57) ABSTRACT

A vibrating element includes a base, drive vibrating arms, detection vibrating arms, and adjustment vibrating arms. The drive vibrating arms are driven to make bending vibration in a predetermined plane. The following expressions (1) and (2) are satisfied:

$$f3 > f2 \qquad (1)$$

$$0.964 \times (1 - 0.321^{(1+L/t)}) \le f2/f1 \le 0.995 \qquad (2)$$

where t represents the thickness of the base, L represents the length of the base in the direction in which the drive vibrating arms extend, f1 represents the frequency of natural vibration of the detection vibrating arms in a direction that intersects the predetermined plane, f2 represents the frequency of natural vibration of the drive vibrating arms in a direction that intersects the predetermined plane, and f3 represents the frequency of natural vibration of the adjustment vibrating arms in a direction that intersects the predetermined plane.

12 Claims, 9 Drawing Sheets

VIBRATING ELEMENT, SENSOR UNIT AND ELECTRONIC APPARATUS

BACKGROUND

1. Technical Field

The present invention relates to an vibrating element, a sensor unit, and an electronic apparatus.

2. Related Art

An vibrating gyro sensor (hereinafter referred to as vibrating gyro) is widely used as an angular velocity sensor that enhances, for example, vehicle-related capabilities, such as vehicle body control and vehicle position detection that is performed by a car navigation system, and optical-apparatus-related capabilities, such as shaking control correction (what is called hand-shake correction) that is performed, for example, by a digital camera and a digital video camcorder. An vibrating gyro includes a gyro vibrating element made of quartz or any other piezoelectric single-crystal material as a highly elastic material, detects an angular velocity in the form of an electric signal produced in part of the gyro vibrating element by swing, rotation, and other vibrating actions of an object of interest, and calculates the angle of rotation to determine the displacement of the object.

As the vibrating element used in a gyro sensor, a piezoelectric vibrating element (vibrating gyro device) made of quartz or any other piezoelectric material has been widely used (see JP-A-5-256723, for example). The vibrating element described in JP-A-5-256723 is what is called a tuning-fork-type piezoelectric vibrating element including a base made of quartz and a pair of vibrating arms extending from one end of the base in parallel to each other. Further, a drive electrode (vibration excitation electrode) is provided on a principal surface (first surface) of each of the vibrating arms, and the drive electrode supplies a drive voltage that causes the vibrating arm to vibrate. A detection electrode is provided on a side surface perpendicular to the first surface of each of the vibrating arms. Each of the vibrating arms is allowed to vibrate when a drive signal (vibration excitation signal) is applied to the drive electrode. When a drive signal is applied to the vibrating element to cause the vibrating arms to vibrate in a direction along the first surface (in-plane vibration), and the vibrating element is rotated around a detection axis extending in the direction in which the vibrating arms extend (for example, Y axis in the case of vibrating gyro device formed of quartz Z plate), the vibrating arms vibrate under a Coriolis force in the direction perpendicular to the first surface (out-of-plane vibration). The amplitude of the out-of-plane vibration, which is proportional to the rotational speed of the vibrating element, can be detected in the form of an angular velocity.

The base and the vibrating arms of the vibrating gyro device described above can be formed as an integral piece by etching quartz or any other suitable piezoelectric material in a photolithography-based process. The vibrating arms are designed to have a rectangular cross-sectional shape, but the actual cross-sectional shape is not a rectangle but is a parallelogram, a rhombus, or a more complicated indefinite shape due to etching anisotropy of quartz, variations in manufacturing processes, and other factors. If the cross-sectional shape of the vibrating arms greatly deviates from an intended rectangular shape, the vibration direction of the vibrating arms deviates from an intended direction, resulting in undesired vibration leakage or what is called a leakage output and causing degradation in detection sensitivity of the vibrating gyro device.

In contrast, JP-A-2010-32482 proposes using a rod-shaped vibrating element having a simple shape and readily processed with precision to form an vibrating element that works as a driver (vibrating arm) and another vibrating element that works as a detector (detection arm) connected to each other. The resultant vibrating element minimizes a leakage output from the detector.

JP-A-2008-209215 proposes a technology for suppressing a leakage output (oblique vibration) from a device formed of a base and vibrating arms extending from the base by setting a portion to be cut in each of the vibrating arms in the vicinity of the base and cutting the portion in laser processing to change the mass distribution of the vibrating arm.

JP-A-2010-32482, however, makes no specific proposal for a method for further suppressing the leakage output based on the configuration in which the two separate vibrating elements, which form the driver and the detector, are connected to each other (specifically, for example, method for further suppressing leakage output resulting from imprecise processing of rod-shaped vibrating element).

On the other hand, the cut portion of the vibrating element described in JP-A-2008-209215 is required to be so small that precise adjustment for leakage output suppression is made. It becomes, however, more difficult in recent years to form such a very small cut portion because an vibrating gyro and hence an vibrating element have been increasingly miniaturized. Further, the formation of the cut portion disadvantageously reduces the mechanical strength of the vibrating element.

To address the problems described above, based on the configuration in which the vibrating arm and the detection arm are formed as two separate vibration portions connected to a base, an adjustment arm for suppressing the leakage output is further separately attached to the base and adjustment is made to suppress the leakage output. Specifically, the mass distribution of the adjustment arm attached to the base is changed, for example, in laser processing to reduce the amount of leakage output. As a result, the amount of leakage output can be reduced without a decrease in mechanical strength of the vibrating element formed of the vibrating arm, the detection arm, and other portions. Newly adding the adjustment arm to the base, however, disadvantageously reduces the detection sensitivity of the vibrating gyro sensor. Specifically, the detection sensitivity can be increased by matching the frequencies of natural vibration of the vibrating arm and the detection arm with each other so that the vibrating arm and the detection arm vibrate in resonance, whereas the newly added adjustment arm causes inconsistency in resonance between the vibrating arm and the detection arm from, disadvantageously resulting in a decrease in detection sensitivity. The problem of a decrease in detection sensitivity occurs not only when an adjustment arm is added to suppress a leakage output but also when any additional portion (protruding portion) is attached to a base.

SUMMARY

An advantage of some aspects of the invention is to solve at least a part of the problems described above, and the invention can be implemented as the following application examples or forms.

Application Example 1

This application example is directed to an vibrating element including an vibrating body having a base, a first vibrating arm extending from one end of the base, and a second vibrating arm extending from the other end of the base that faces away from the one end; and a protruding portion extending from the vibrating body along the direction in which the second vibrating arm extends. One of the first vibrating arm and the second vibrating arm is a drive vibrating arm, and the other is a detection vibrating arm. The drive vibrating arm is driven to make bending vibration in a predetermined plane. The following expressions (1) and (2) are satisfied:

$$f3 > f2 \tag{1}$$

$$0.964 \times (1 - 0.321^{(1+L/t)}) \leq f2/f1 \leq 0.995 \tag{2}$$

where t represents the thickness of the base, L represents the length of the base in the direction in which the second vibrating arm extends, f1 represents the frequency of natural vibration of the first vibrating arm in a direction that intersects the predetermined plane, f2 represents the frequency of natural vibration of the second vibrating arm in a direction that intersects the predetermined plane, and f3 represents the frequency of natural vibration of the protruding portion in a direction that intersects the predetermined plane.

According to this application example, the vibrating element has the drive vibrating arm and the detection vibrating arm separately but continuously provided with the base therebetween. For example, in an vibrating gyro having the configuration in which the drive vibrating arm and the detection vibrating arm are formed separately from each other, to improve angular velocity detection sensitivity, it is important to adjust the natural vibration frequencies of the drive and detection vibrating arms when they are designed. Specifically, provided that the drive vibrating arm is making bending vibration in a predetermined plane (hereinafter referred to as in-plane vibration), the detection sensitivity of the vibrating gyro depends on the efficiency at which out-of-plane vibration (vibration in direction that intersects in-plane vibration) produced in the drive vibrating arm when an angular velocity is applied to the drive vibrating arm is transmitted to the detection vibrating arm connected to the base and causes the detection vibrating arm to make out-of-plane vibration. The transmission efficiency increases when the out-of-plane vibration of the drive vibrating arm and the out-of-plane vibration of the detection vibrating arm resonate with each other.

On the other hand, the vibrating element according to this application example is not formed of an vibrating body having a configuration in which only the drive vibrating arm and the detection vibrating arm are simply connected to each other but has a configuration in which the vibrating body is further provided with the protruding portion. In the case of an vibrating gyro, the protruding portion corresponds, for example, to an adjustment vibrating arm for suppressing a leakage output. In the configuration described above, it is necessary to adjust the vibration frequency in consideration of an effect of the protruding portion, and the present inventor has found that the vibration transmission efficiency at which vibration is transmitted from the drive vibrating arm to the detection vibrating arm can be increased by setting an vibration frequency that satisfies the expressions (1) and (2) described above. Therefore, in the case of an vibrating element, such as an vibrating gyro, having the configuration described above (that is, configuration in which vibrating body is further provided with protruding portion), the vibrating element can have high detection sensitivity by designing the vibrating element in such a way that the expressions (1) and (2) described above are satisfied.

Application Example 2

This application example is directed to the vibrating element according to the application example described above, wherein the following expression (3) is satisfied.

$$f2/f1 = 0.976 \times (1 - 0.237^{(1+L/t)}) \tag{3}$$

The present inventor further found that setting an vibration frequency that satisfies the expression (3) described above further increases the vibration transmission efficiency at which vibration is transmitted from the drive vibrating arm to the detection vibrating arm. It is therefore further preferable to satisfy the expression (3), as in this application example. The thus configured vibrating element can have higher detection sensitivity.

Satisfying the expression (3) means that the vibrating element is so designed and manufacturing processes thereof are so controlled that the expression (3) is satisfied.

Application Example 3

This application example is directed to the vibrating element according to the application example described above, wherein the vibrating body further has a support that supports the base and a connection arm that connects the base and the support to each other, and the protruding portion extends from the support or the connection arm along the direction in which the second vibrating arm extends.

According to this application example, the vibrating element further has the support and the connection arm that connects the base and the support to each other, and the protruding portion extends from the support or the connection arm along the direction in which the second vibrating arm extends. The thus configured vibrating element also has high detection sensitivity when the expressions described above are satisfied. Therefore, according to this application example, an vibrating element including a support and having high detection sensitivity can be provided.

Application Example 4

This application example is directed to a sensor unit including any of the vibrating elements described above and an electronic part including a drive circuit that causes the drive vibrating arm to vibrate and a detection circuit that detects a detection signal produced in the detection vibrating arm.

The sensor unit according to this application example, which includes the drive circuit that causes the drive vibrating arm to vibrate, the detection circuit that detects a detection signal produced in the detection vibrating arm, and the vibrating element capable of higher-sensitivity detection than in related art, can have stable characteristics.

Application Example 5

This application example is directed to an electronic apparatus including any of the vibrating elements described above.

The electronic apparatus according to this application example, which includes the vibrating element capable of higher-sensitivity detection than in related art, can have stable characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments in which the invention is implemented will be described below with reference to the drawings. The following description is made of embodiments of the invention but does not limit the invention. The following figures are not drawn to scale in some cases for ease of description.

First Embodiment

Vibrating Gyro Device

Figure 1:
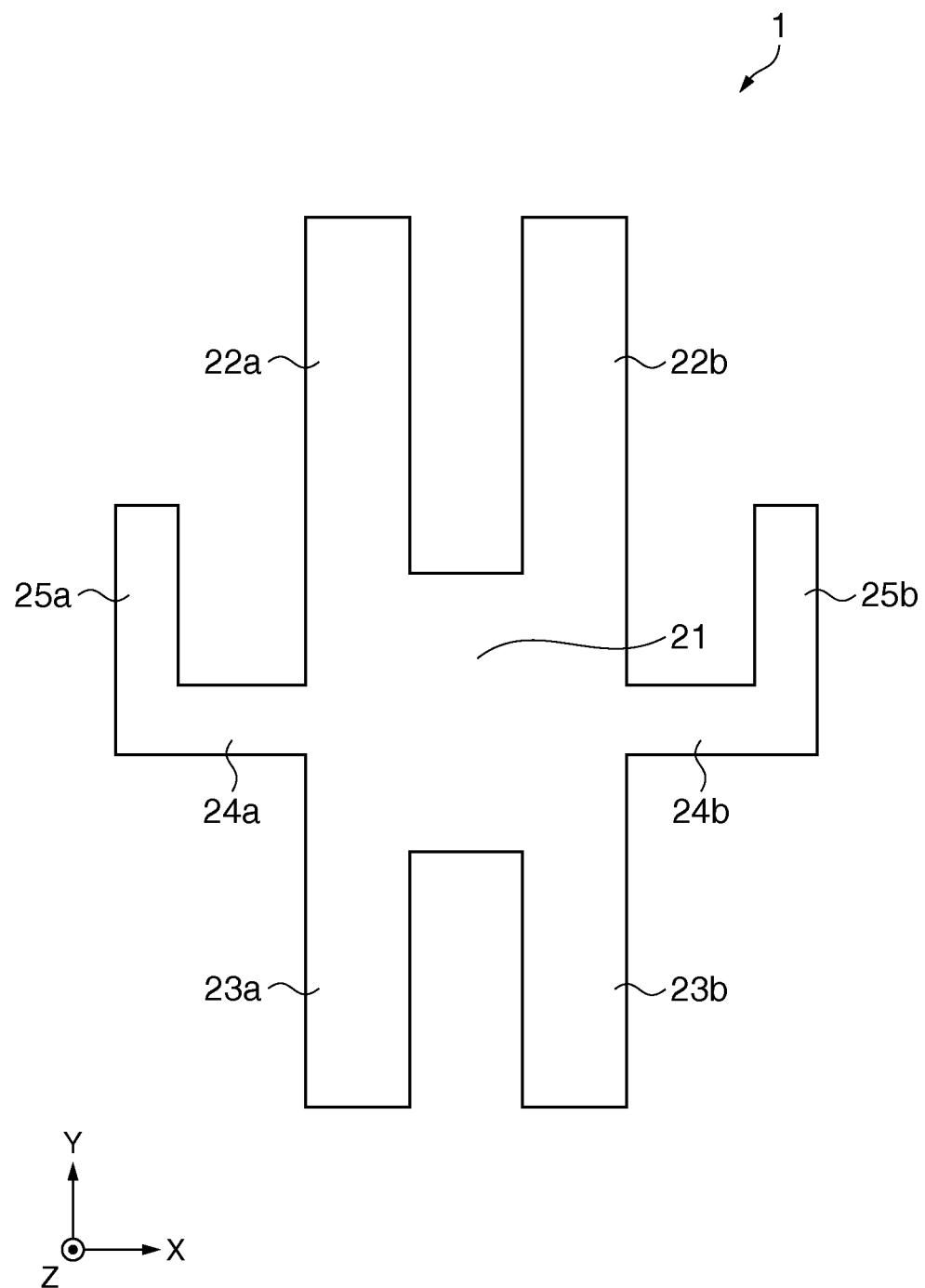
FIG. 1 is a schematic plan view showing an vibrating gyro device in the form of an vibrating element.

A description will first be made of an vibrating element according to an embodiment of the invention implemented as an vibrating gyro device. FIG. 1 is a schematic plan view showing an embodiment of the vibrating gyro device in the form of an vibrating element.

An vibrating gyro device 1 in the form of an vibrating element includes a base 21, drive vibrating arms 22a and 22b as second vibrating arms, detection vibrating arms 23a and 23b as first vibrating arms, and adjustment vibrating arms 25a and 25b as protruding portions, and the components described above are formed as an integral piece by processing a base material (material of which primary portion is made), as shown in FIG. 1.

The vibrating gyro device 1 according to this embodiment will be described with reference to a case where the base material is quartz, which is a piezoelectric material. Quartz has an X axis called an electric axis, a Y axis called a mechanical axis, and a Z axis called an optical axis. Specifically, this embodiment will be described with reference to a case where the base material is what is called a quartz Z plate produced by cutting a quartz block along a plane defined by the X and Y axes perpendicular to each other as quartz crystal axes and shaping the cut quartz into a flat plate having a predetermined thickness in the Z-axis direction perpendicular to the plane. The predetermined thickness used herein is set as appropriate in accordance with the vibration frequency (resonant frequency), the exterior size, the processibility, and other factors of the vibrating gyro device.

When the flat plate that forms the vibrating gyro device 1 is cut from a quartz block, there is an inevitable error in cutting angle, and certain amounts of cutting angle errors with respect to the X, Y, and Z axes are acceptable. For example, a flat plate cut from a quartz block along a plane that deviates from the X axis by 0 to 2 degrees is usable. The same holds true for the Y and Z axes.

The components of the vibrating gyro device 1 are configured as follows. The base 21 is positioned at the center of the vibrating gyro device 1 and has a substantially rectangular shape; the drive vibrating arms 22a and 22b as a pair of second vibrating arms extend from one of the Y-axis-side ends of the base 21 (+Y-axis-side end in FIG. 1) along the Y axis in parallel to each other; and the detection vibrating arms 23a and 23b as a pair of first vibrating arms extend from the other Y-axis-side end of the base 21 (−Y-axis-side end in FIG. 1) along the Y axis in parallel to each other. The vibrating gyro device 1, which is so shaped that the corresponding vibrating arms of the pair of drive vibrating arms 22a and 22b and the pair of detection vibrating arms 23a and 23b extend from the opposite ends of the base 21 in the coaxial direction, is called an H-type vibrating element (H-type vibrating gyro device) in some cases. The H-type vibrating gyro device 1, in which the corresponding vibrating arms of the drive vibrating arms 22a and 22b and the detection vibrating arms 23a and 23b extend from the opposite ends of the base 21 that lie on the same axial direction, has a drive system and a detection system separated from each other, whereby the amount of electrostatic coupling between electrodes or wiring lines of the drive system and those of the detection system is reduced and hence stable detection sensitivity is achieved.

Further, the adjustment vibrating arms 25a and 25b of the vibrating gyro device 1 provided as a pair of protruding portions extend in a direction that intersects the crystal X axis (electric axis) of the quartz. In the vibrating gyro device 1 according to this embodiment, the adjustment vibrating arms 25a and 25b extend from the front ends of a pair of connection arms 24a and 24b, which extend along the X axis from the ends of the base 21 opposite each other in the direction perpendicular to the drive vibrating arms 22a and 22b and the detection vibrating arms 23a and 23b (X-axis direction), in parallel to the drive vibrating arms 22a and 22b. That is, the adjustment vibrating arms 25a and 25b extend from the front ends of the connection arms 24a and 24b along the Y axis (in +Y direction).

The adjustment vibrating arms 25a and 25b as protruding portions are so formed that the total length thereof is shorter than that of the drive vibrating arms 22a and 22b as the second vibrating arms and the detection vibrating arms 23a and 23b as the first vibrating arms. Vibration of the thus configured adjustment vibrating arms 25a and 25b for leakage output adjustment does not disturb primary vibration of the vibrating gyro device 1 produced by the second vibrating arms and the first vibrating arms (drive vibrating arms and detection vibrating arms), which is advantageous to the vibrating gyro device 1 in terms of stable vibration characteristics and small size.

The center of the base 21 can be the center of gravity as a gravitationally central position of the vibrating gyro device 1. It is assumed that the X axis, the Y axis, and the Z axis are perpendicular to each other and pass through the center of gravity. The exterior shape of the vibrating gyro device 1 can be symmetrical with respect to a virtual central line passing through the center of gravity and extending in the Y-axis direction. The thus formed vibrating gyro device 1 has a well-balanced exterior shape and stable characteristics, whereby the detection sensitivity is preferably improved.

The exterior shape of the vibrating gyro device 1 described above can be formed in an etching process (wet or dry etching process) using a photolithography technology. It is noted that a plurality of vibrating gyro devices 1 can be formed from a single quartz wafer.

An embodiment of how electrodes are arranged in the vibrating gyro device 1 will next be described with reference to the drawings.

Figure 2:
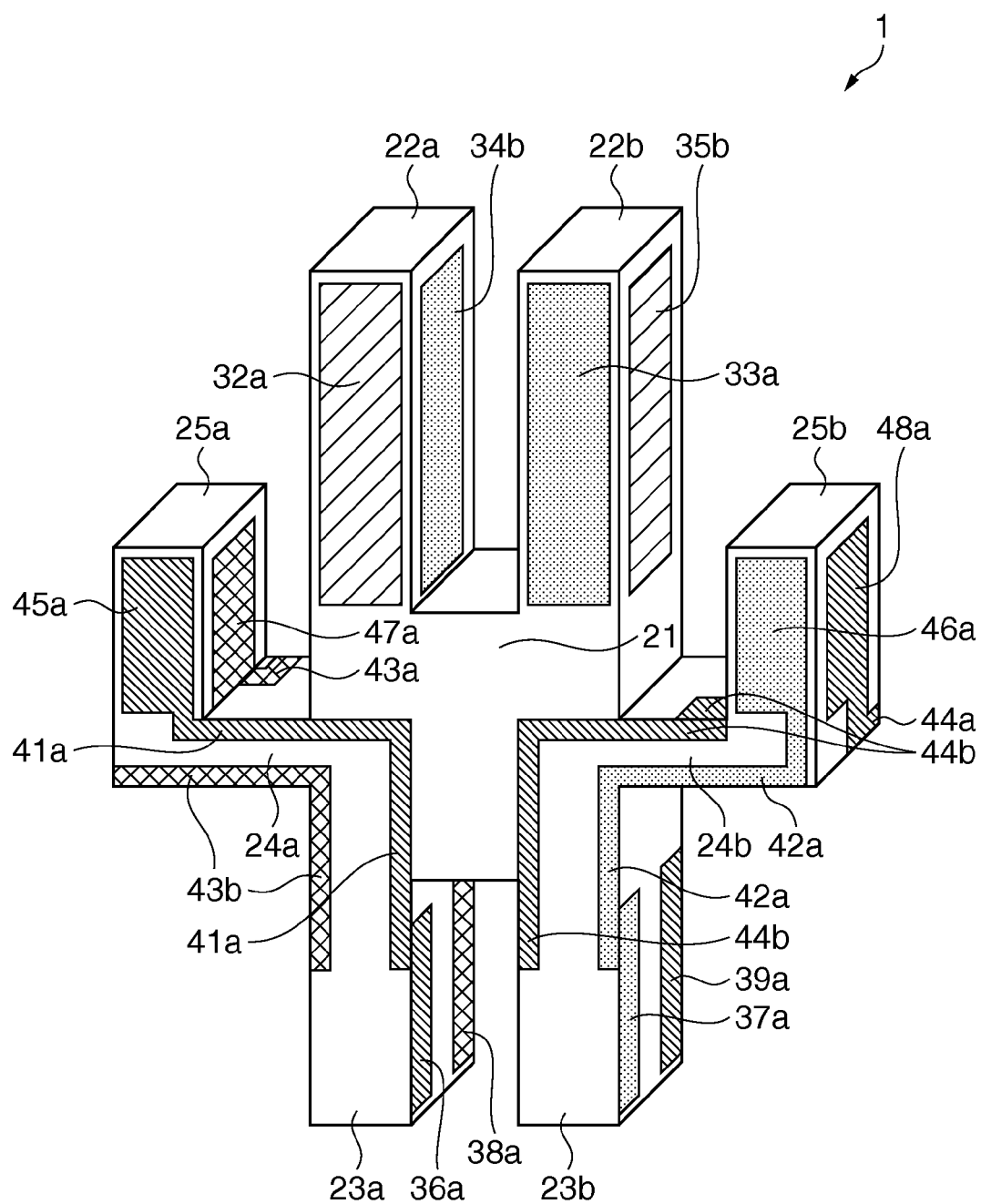
FIG. 2 is a schematic perspective view showing how electrodes are arranged in the vibrating gyro device when obliquely viewed from the side where one principal surface thereof is present.
Figure 3:
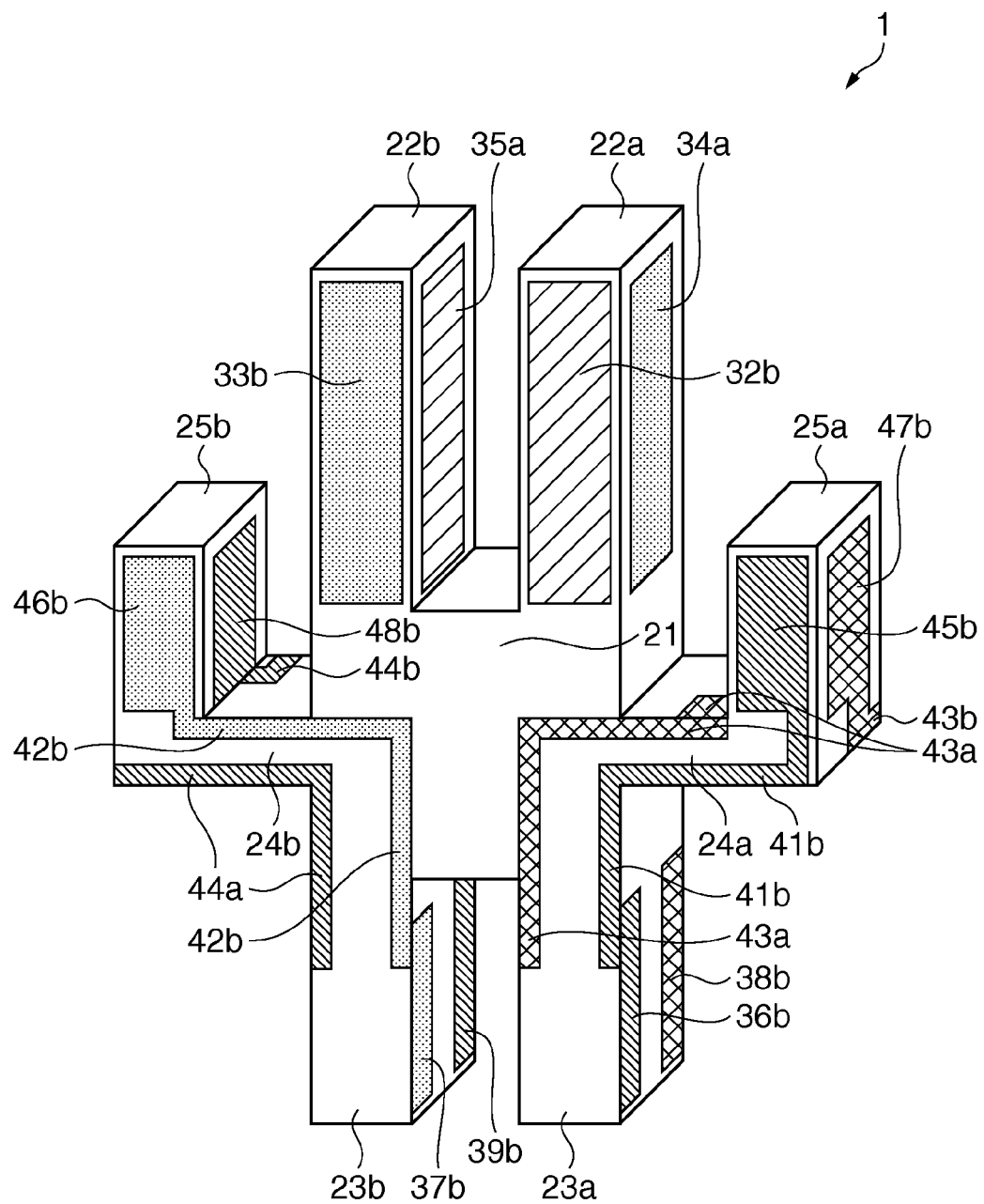
FIG. 3 a schematic perspective view showing how electrodes are arranged in the vibrating gyro device when obliquely viewed from the side where the other principal surface thereof is present.

FIG. 2 is a schematic perspective view showing how electrodes are arranged in the vibrating gyro device 1 when obliquely viewed from the side where one principal surface thereof is present, and FIG. 3 is a schematic perspective view showing how electrodes are arranged in the vibrating gyro device 1 when obliquely viewed from the side where the other principal surface thereof is present.

FIGS. 2 and 3 primarily describe electrode connection specific to the electrode arrangement in this embodiment between the detection vibrating arms 23a, 23b and the adjustment vibrating arms 25a, 25b. Connection of drive-system electrodes provided on the drive vibrating arms 22a and 22b (drive electrode connection) is the same as drive-system electrode connection in an vibrating gyro device of related art and is therefore not described.

Electrodes provided on the drive vibrating arms 22a and 22b will first be described.

In FIG. 2, drive electrodes 32a and 33a, which are drive electrodes for applying a drive voltage, are provided on one of two principal surfaces of the pair of drive vibrating arms 22a and 22b, which extend from one end of the base 21 of the vibrating gyro device 1 in parallel to each other. Drive electrodes 34b and 35b are further provided on one of two side surfaces of the drive vibrating arms 22a and 22b.

Further, drive electrode 32b and 33b are provided on the other principal surfaces of the drive vibrating arms 22a and 22b that face the principal surfaces described above, as shown in FIG. 3. Drive electrodes 34a and 35a are further provided on the other side surfaces of the drive vibrating arms 22a and 22b that face the side surfaces described above.

The drive electrodes 32a, 32b, 33a, and 33b and the drive electrodes 34a, 34b, 35a, and 35b provided on the two principal surfaces and the two side surfaces of the drive vibrating arms 22a and 22b are so connected with connection wiring lines (not shown) that the two principal surfaces facing each other (front surface and rear surface) have the same potential and the two side surfaces facing each other and connecting the two principal surfaces to each other (inner side surface and outer side surface) have the same potential. In this embodiment, the electrodes provided on one of the drive vibrating arms, the drive vibrating arm 22a, are so configured that the drive electrodes 32a and 32b provided on the two principal surfaces have the same potential and the drive electrodes 34a and 34b provided on the two side surfaces have the same potential, and the electrodes provided on the other one of the drive vibrating arms, the drive vibrating arm 22b, are so configured that the drive electrodes 33a and 33b provided on the two principal surfaces have the same potential and the drive electrodes 35a and 35b provided on the two side surfaces have the same potential. One of the sets of drive electrodes facing each other and having the same potential on each of the drive vibrating arms 22a and 22b, for example, the drive electrodes 32a and 32b provided on the two principal surfaces of the drive vibrating arm 22a and the drive electrodes 35a and 35b provided on the two side surfaces of the drive vibrating arm 22b are ground electrodes.

Electrodes provided on the detection vibrating arms 23a and 23b will next be described.

In FIG. 2, detection electrodes 36a and 38a and detection electrodes 37a and 39a, which are detection electrodes for detecting distortion of the base material (quartz) produced by vibration, are provided on one of two side surfaces of detection vibrating arms 23a and 23b, which extend from the other end of the base 21 of the vibrating gyro device 1 in parallel to each other. Specifically, a pair of detection electrodes 36a and 38a, which have different potentials, are provided on one of the two side surfaces of the detection vibrating arm 23a, which is one of the pair of detection vibrating arms 23a and 23b, in the vicinity of the two ends of the side surface along the direction in which the detection vibrating arm 23a extends. Similarly, a pair of detection electrodes 37a and 39a, which have different potentials, are provided on one side surface of the detection vibrating arm 23b in the vicinity of the two ends of the side surface along the direction in which the detection vibrating arm 23b extends.

Further, detection electrodes 37b and 39b and detection electrodes 36b and 38b are provided on the other side surfaces of the detection vibrating arms 23a and 23b that face the side surfaces described above, as shown in FIG. 3. Specifically, a pair of detection electrodes 36b and 38b, which have different potentials, are provided on the other side surface of the detection vibrating arm 23a, which is one of the pair of detection vibrating arms 23a and 23b, in the vicinity of the two ends of the side surface along the direction in which the detection vibrating arm 23a extends. Similarly, a pair of detection electrodes 37b and 39b, which have different potentials, are provided on the other side surface of the detection vibrating arm 23b in the vicinity of the two ends of the side surface along the direction in which the detection vibrating arm 23b extends.

Further, the detection electrodes located on the two side surfaces of each of the detection vibrating arms 23a and 23b and facing each other have the same potential. That is, located on the two side surfaces of the detection vibrating arm 23a, the detection electrodes 36a and 36b facing each other have the same potential, and the detection electrodes 38a and 38b facing each other have the same potential. Similarly, located on the two side surfaces of the detection vibrating arm 23b, the detection electrodes 37a and 37b facing each other have the same potential, and the detection electrodes 39a and 39b facing each other have the same potential. One of the sets of detection electrodes facing each other and having the same potential on each of the detection vibrating arms 23a and 23b, for example, the detection electrodes 38a and 38b provided on the two side surfaces of the detection vibrating arm 23a and facing each other and the detection electrodes 39a and 39b provided on the two side surfaces of the detection vibrating arm 23b and facing each other are ground electrodes.

Electrodes (film members) provided as adjusters on the adjustment vibrating arms 25a and 25b will next be described.

In FIG. 2, adjustment electrodes 45a and 46a are provided as adjusters on one of principal surfaces of the pair of adjustment vibrating arms 25a and 25b, which extend in parallel to the drive vibrating arms 22a and 22b from the front ends of the pair of connection arms 24a and 24b extending from the two ends of the base 21 of the vibrating gyro device 1 that are perpendicular to the one end and the other end of the base 21. Adjustment electrodes 47a and 48a are further provided as adjusters on one of side surfaces of the adjustment vibrating arms 25a and 25b.

Further, adjustment electrodes 45b and 46b are provided as adjusters on the other principal surfaces of the adjustment vibrating arms 25a and 25b that face the principal surfaces described above, as shown in FIG. 3. Adjustment electrodes 47b and 48b are further provided as adjusters on the other side surfaces of the adjustment vibrating arms 25a and 25b that face the side surfaces described above.

In this embodiment, the detection electrodes on the detection vibrating arms 23a and 23b and the corresponding adjustment electrodes on the adjustment vibrating arms 25a and 25b are electrically connected to each other.

Specifically, the electrodes on the detection vibrating arm 23a and the corresponding electrodes on the adjustment vibrating arm 25a are connected to each other as follows: The detection electrode 36a and the adjustment electrode 45a are connected to each other with an inter-electrode wiring line 41a; the detection electrode 38a and the adjustment electrode 47a are connected to each other with an inter-electrode wiring line 43a; the detection electrode 36b and the adjustment electrode 45b are connected to each other with an inter-electrode wiring line 41b; and the detection electrode 38b and the adjustment electrode 47b are connected to each other with an inter-electrode wiring line 43b, as shown in FIGS. 2 and 3.

Similarly, the electrodes on the detection vibrating arm 23b and the corresponding electrodes on the adjustment vibrating arm 25b are connected to each other as follows: The detection electrode 37a and the adjustment electrode 46a are connected to each other with an inter-electrode wiring line 42a; the detection electrode 39a and the adjustment electrode 48a are connected to each other with an inter-electrode wiring line 44a; the detection electrode 37b and the adjustment electrode 46b are connected to each other with an inter-electrode wiring line 42b; and the detection electrode 39b and the adjustment electrode 48b are connected to each other with an inter-electrode wiring line 44b.

According to the vibrating gyro device 1 of the first embodiment described above, in addition to the configuration of the H-type vibrating element, in which the pair of drive vibrating arms 22a and 22b and the pair of detection vibrating arms 23a and 23b extend from the Y-axis-side opposite ends of the base 21 along the Y axis in parallel to each other, the adjustment vibrating arms 25a and 25b are provided as protruding portions, which extend in a direction that intersects the quartz X axis (direction along the Y axis in this embodiment) from the front ends of the pair of connection arms 24a and 24b, which extend from the X-axis-side opposite ends of the base 21 along the X-axis direction. The adjustment electrodes 45a, 45b, 46a, 46b, 47a, 47b, 48a, and 48b are provided as film members on the two principal surfaces and the two side surfaces of the adjustment vibrating arms 25a and 25b and electrically connected to the corresponding detection electrodes provided on the detection vibrating arms 23a and 23b.

According to the thus configured vibrating gyro device 1, when an angular velocity is applied to the vibrating gyro device 1 with a predetermined vibration exciting signal having been applied to the drive vibrating arms 22a and 22b so that they vibrate, the detection vibrating arms 23a and 23b vibrate under a Coriolis force and cause the adjustment vibrating arms 25a and 25b to vibrate. An undesired leakage output produced by the detection vibrating arms 23a and 23b can be suppressed by increasing or decreasing the weights of the film members (adjustment electrodes in this embodiment) provided on the adjustment vibrating arms 25a and 25b or increasing or decreasing the volumes of the adjustment electrodes as film members to change the amount of charge. It is therefore possible to suppress an decrease in the detection sensitivity resulting from a leakage output that may occur when the drive vibrating arms 22a and 22b and the detection vibrating arms 23a and 23b have undesired cross-sectional shapes due, for example, to etching anisotropy of quarts, which is a base material of the vibrating gyro device 1, or variations in manufacturing processes, whereby an vibrating gyro device in the form of a high-sensitivity vibrating element can be provided.

Figure 4:
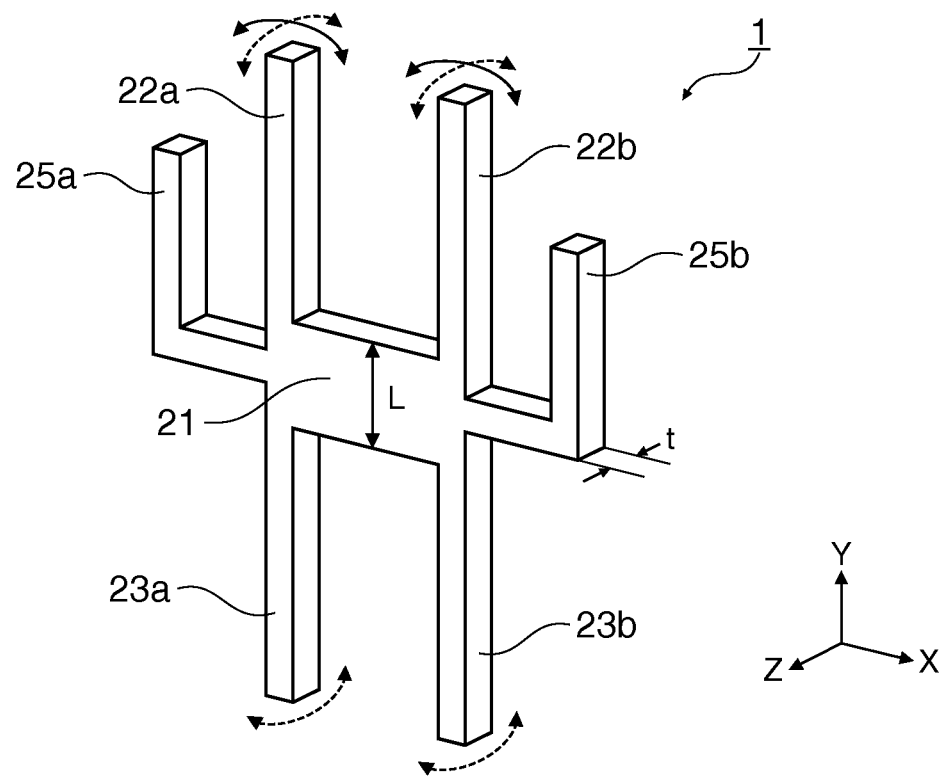
FIG. 4 is a schematic perspective view showing vibration of the vibrating gyro device.
Figure 5A:
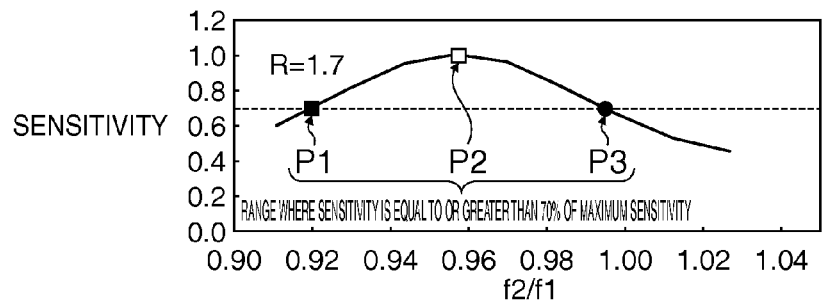
FIGS. 5A to 5E show graphs of evaluation results representing change in sensitivity versus a frequency ratio (f2/f1) for various lengths L of a base.
Figure 5B:
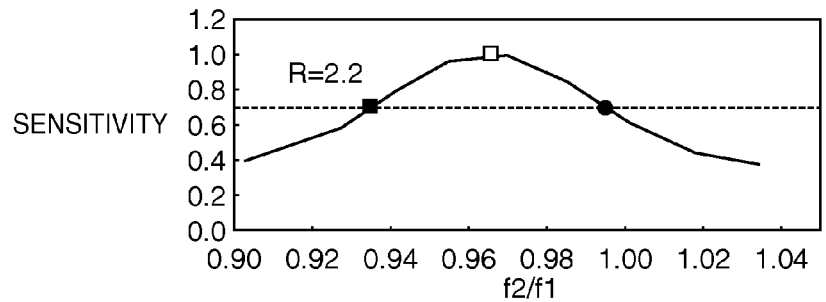
Figure 5C:
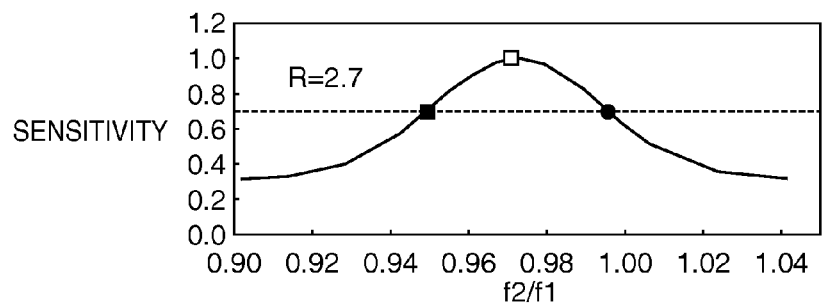
Figure 5D:
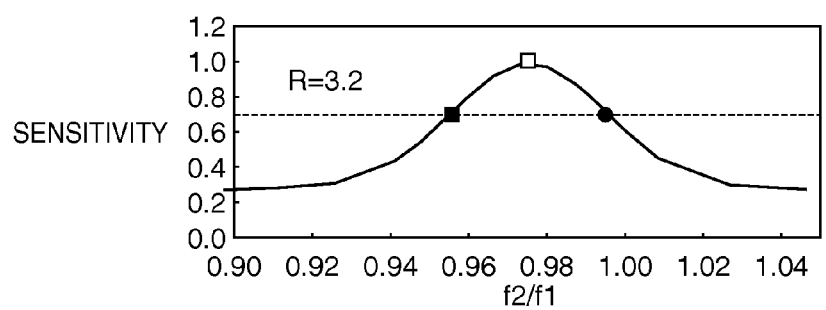
Figure 5E:
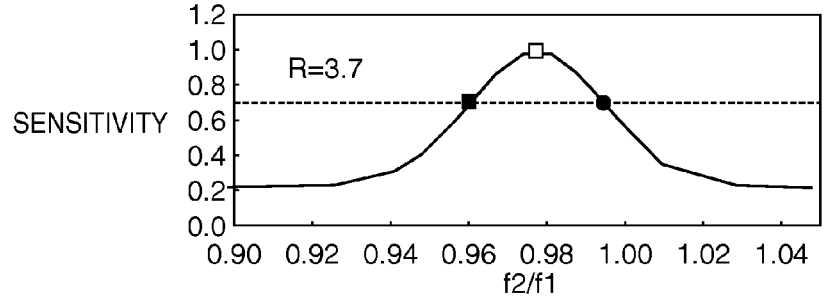

FIG. 4 is a schematic perspective view showing vibration of the vibrating gyro device 1.

In FIG. 4, solid-line arrows indicate in-plane vibration, and broken-line arrows indicate out-of-plane vibration. The in-plane vibration is bending vibration of the drive vibrating arms 22a and 22b that occurs in the XY plane as a predetermined plane when a predetermined vibration excitation signal is applied to the drive vibrating arms 22a and 22b. The out-of-plane vibration is vibration that occurs in a direction that intersects the predetermined plane under a Coriolis force.

In the case of an vibrating gyro device having a configuration in which drive vibrating arms and detection vibrating arms are separately provided as in the vibrating gyro device 1, to increase the angular velocity detection sensitivity, it is important to adjust the vibration frequencies of the two types of vibrating arms. Specifically, the detection sensitivity of the vibrating gyro device 1 depends on how efficiently vibration of the drive vibrating arms 22a and 22b is transmitted to the detection vibrating arms 23a and 23b. Since the vibration transmission efficiency increases when the two types of vibrating arms resonate with each other, it is generally preferable to match the frequency of natural vibration of the detection vibrating arms 23a and 23b to the frequency of out-of-plane vibration of the drive vibrating arms 22a and 22b.

On the other hand, the vibrating gyro device 1 is not formed of an vibrating body having a configuration in which only the pair of drive vibrating arms 22a and 22b and the pair of detection vibrating arms 23a and 23b are simply connected to each other but has a configuration in which the vibrating body is further provided with the adjustment vibrating arms 25a and 25b as protruding portions via the connection arms 24a and 24b. Since it is necessary for a configuration of this type to adjust the vibration frequency thereof in consideration of an effect of the adjustment vibrating arms 25a and 25b, the drive vibrating arms 22a and 22b, the detection vibrating arms 23a and 23b, and the adjustment vibrating arms 25a and 25b are configured as follows.

Now, let f1 be the frequency of out-of-plane natural vibration of the detection vibrating arms 23a and 23b, f2 be the frequency of out-of-plane natural vibration of the drive vibrating arms 22a and 22b, f3 be the frequency of out-of-plane natural vibration of the adjustment vibrating arms 25a and 25b as protruding portions, and R (=L/t) be the ratio of the length L of the base 21 in the Y direction to the thickness t of the vibrating gyro device 1. The parameters described above are so set that the following expressions (1) and (2) are satisfied:

$$f3 > f2 \quad (1)$$

$$0.964 \times (1-0.321^{(1+R)}) \leq f2/f1 \leq 0.995 \quad (2)$$

where $0.321^{(1+R)}$ represents 0.321 raised to the (1+R) power.

The present inventor has found that employing an vibration frequency that satisfies the expressions (1) and (2) described above can increase the vibration transmission efficiency at which vibration is transmitted from the drive vibrating arms 22a and 22b to the detection vibrating arms 23a and 23b.

The present inventor has further found that employing an vibration frequency that satisfies the following expression (3) further increases the vibration transmission efficiency. It is therefore more preferable to design an vibrating gyro device and control manufacturing processes thereof in such a way that the following expression (3) is satisfied.

$$f2/f1 = 0.976 \times (1-0.237^{(1+R)})$$

The expressions (1) to (3) described above will be specifically described below.

First, the expression (1) means that the frequency of out-of-plane natural vibration of the adjustment vibrating arms 25a and 25b (f3) is set to be greater than the frequency of out-of-plane natural vibration of the drive vibrating arms 22a and 22b (f2). Satisfying the expression (1) prevents vibration of the adjustment vibrating arms 25a and 25b for leakage output adjustment from disturbing primary vibration of the vibrating gyro device 1 produced by the drive vibrating arms 22a and 22b and the detection vibrating arms 23a and 23b, whereby stable vibration characteristics of the vibrating gyro device 1 can be provided.

The expressions (2) and (3) will next be described with reference to FIGS. 5A to 5E and 6.

FIGS. 5A to 5E show graphs of evaluation results representing change in sensitivity versus the frequency ratio (f2/f1) for various lengths L of the base 21. Specifically, the horizontal and vertical axes in FIGS. 5A to 5E represent the frequency ratio (f2/f1) and the sensitivity respectively, and the five graphs represent the sensitivity characteristic for R(=L/t) values ranging from 1.7 to 3.7 and changing in increments of 0.5. The sensitivity is normalized by assuming that the maximum sensitivity is 1.0. The broken line in each of the figures represents 70% of the maximum sensitivity (70% line). P1 and P3 indicate intersections of the 70% line and the sensitivity characteristic curve, and P2 represents the position of peak sensitivity.

As indicated by the graphs, each sensitivity peak (P2) is shifted from the point where f1 and f2 are equal to each other (f2/f1=1.0). Further, the range of the frequency ratio (f2/f1) where the sensitivity is greater than or equal to 70% of the maximum sensitivity changes with R.

Figure 6:
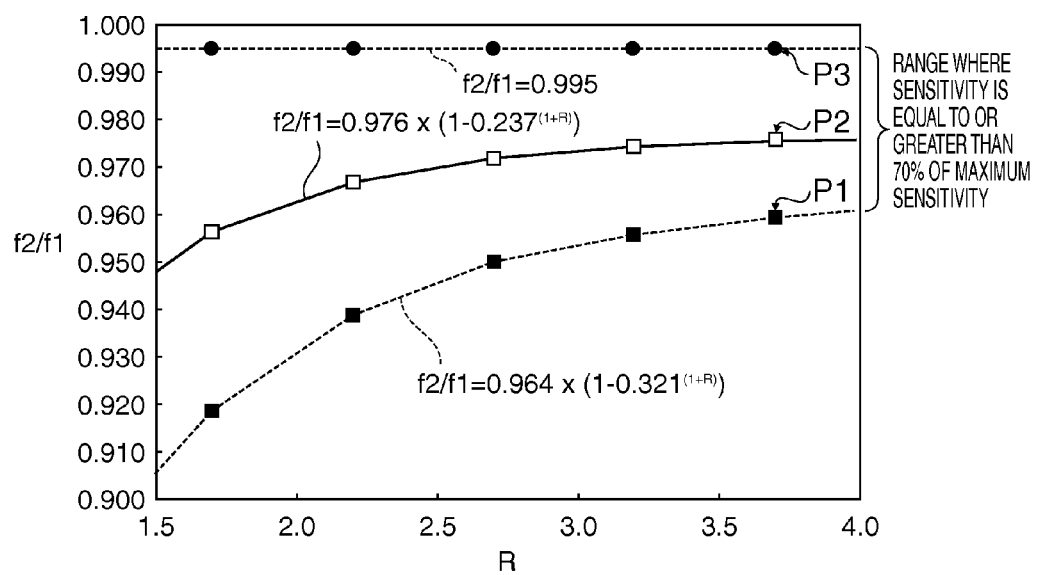
FIG. 6 shows graphs illustrating the range of the frequency ratio (f2/f1) where sensitivity is greater than or equal to 70% of maximum sensitivity versus R.

FIG. 6 shows graphs illustrating the range of the frequency ratio (f2/f1) where sensitivity is greater than or equal to 70% of the maximum sensitivity versus R. Specifically, the horizontal and vertical axes in FIG. 6 represent R (=L/t) and the frequency ratio (f2/f1) respectively, and P1 to P3 obtained in FIGS. 5A to 5E are plotted in FIG. 6.

Based on the graphs illustrating the relationship between the frequency ratio (f2/f1) and R, the following approximations are derived from the plotted points P1 to P3.

An approximation derived from the points P1:

$$f2/f1=0.964 \times (1-0.321^{(1+R)})$$

An approximation derived from the points P2:

$$f2/f1=0.976 \times (1-0.237^{(1+R)})$$

An approximation derived from the points P3: f2/f1=0.995

That is, the expression (2) means the relationship between the frequency ratio (f2/f1) that provides sensitivity greater than or equal to 70% of the maximum sensitivity and R, and the expression (3) means the relationship between the frequency ratio (f2/f1) that provides the maximum sensitivity and R.

As described above, the vibrating gyro device 1 in the form of an vibrating element according to this embodiment provides the following advantageous effects.

When the expression (2) described above is satisfied, the drive vibrating arms 22a and 22b and the detection vibrating arms 23a and 23b tend to resonate with each other, whereby the angular velocity detection sensitivity of the vibrating gyro device 1 is improved.

When the expression (3) is satisfied, the resonance between the drive vibrating arms 22a, 22b and the detection vibrating arms 23a, 23b is maximized or nearly maximized, whereby the angular velocity detection sensitivity of the vibrating gyro device 1 is further improved.

The vibrating gyro device 1 in the form of an vibrating element according to this embodiment can therefore provide a high detection sensitivity vibrating element.

The above embodiment has been described with reference to the case where the drive vibrating arms 22a and 22b are the second vibrating arms and the detection vibrating arms 23a and 23b are the first vibrating arms. Alternatively, the second vibrating arms may be the detection vibrating arms 23a and 23b, and the first vibrating arms may be the drive vibrating arms 22a and 22b.

In this case, the adjustment vibrating arms 25a and 25b as protruding portions are provided along the direction in which the detection vibrating arms 23a and 23b as the second vibrating arms extend. Further, f1 is the frequency of out-of-plane natural vibration of the drive vibrating arms 22a and 22b as the first vibrating arms, and f2 is the frequency of out-of-plane natural vibration of the detection vibrating arms 23a and 23b as the second vibrating arms.

Second Embodiment

Gyro Sensor

A gyro sensor 50 as a sensor unit according to a second embodiment will next be described. In the description, the same components as those in the embodiment described above have the same reference characters and no redundant description of the same components will be made.

Figure 7A:
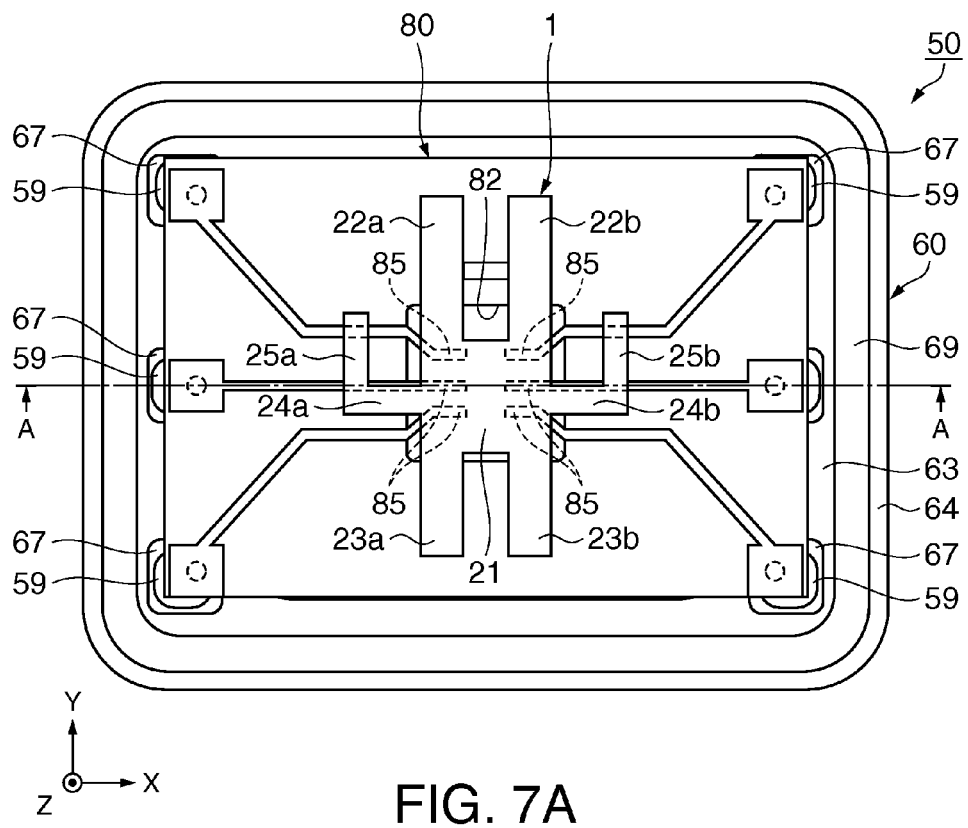
FIG. 7A is a schematic plan view of a gyro sensor in which the vibrating gyro device is incorporated.
Figure 7B:
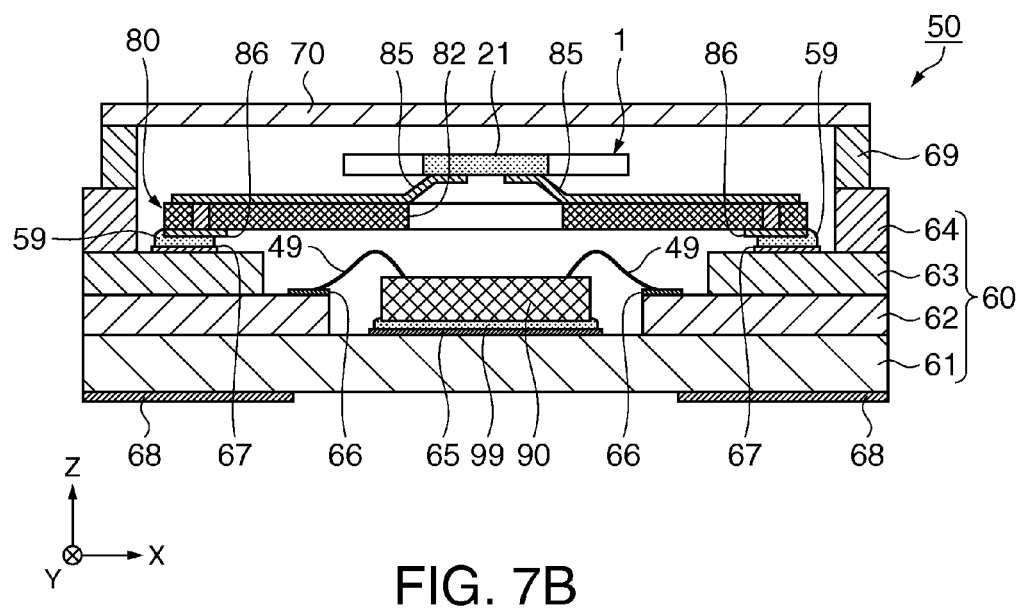
FIG. 7B is a cross-sectional view of the gyro sensor taken along the line A-A in FIG. 7A.

FIGS. 7A and 7B describe the gyro sensor 50. FIG. 7A is a schematic plan view of the gyro sensor 50 viewed from above, and FIG. 7B is a schematic cross-sectional view of the gyro sensor 50 taken along the line A-A in FIG. 7A.

FIG. 7A shows a state in which a lid 70 as a lid member that is an upper portion of the gyro sensor 50 is removed for ease of description of the inner structure of the gyro sensor 50. The configuration of the gyro sensor 50 according to this embodiment will be described with reference to a case where the vibrating gyro device 1 according to the embodiment described above is incorporated as an vibrating element.

The gyro sensor 50 includes a package 60 having a recess, the lid 70 as a lid member that closes an opening of the package 60, the vibrating gyro device 1 bonded into the package 60 via a relay substrate 80, and an IC chip 90 as an electronic part, as shown in FIGS. 7A and 7B.

The recess of the package 60 has steps and protrusions and is formed, for example, by first placing a first layer substrate 61 having a flat plate shape and then stacking a second layer substrate 62, a third layer substrate 63, and a fourth layer substrate 64 having rectangular frame shapes and openings having different sizes in this order on the first layer substrate 61. The thus formed recess can accommodate the vibrating gyro device 1 and the IC chip 90. The package 60 can be made, for example, of a ceramic or glass material.

A die pad 65, on which the IC chip 90 is disposed, is provided on the first layer substrate 61, which forms a recess bottom portion of the recess of the package 60. Exterior mounting terminals 68, which can be bonded to an external substrate, are provided on the surface of the first layer substrate 61 that differs from the surface on which the die pad 65 is provided and forms an outer bottom surface of the package 60.

A plurality of IC connection terminals 66, which are bonded to a plurality of corresponding electrode pads (not shown) provided on an active surface of the IC chip 90 (upper surface in FIG. 7B), are provided on the step so formed by the second layer substrate 62 that the step surrounds the die pad 65 in the recess of the package 60.

Further, above the second layer substrate 62 on which the plurality of IC connection terminals 66 are provided, vibrating element connection terminals 67, which are bonded to the vibrating gyro device 1 via the relay substrate 80, are provided on the step so formed by the third layer substrate 63 that the step surrounds the IC connection terminals 66.

Each of the variety of terminals described above provided in the package 60 is connected to the corresponding terminal with a routed wiring line, a through hole, or any other intralayer wiring line (not shown).

The IC chip 90 includes a drive circuit as an vibration excitation unit that drives and causes the vibrating gyro device 1 to vibrate and a detection circuit as a detection unit that detects detectable vibration produced in the vibrating gyro device 1 when an angular velocity is applied thereto. Specifically, the drive circuit provided in the IC chip 90 supplies a drive signal to each of the drive electrodes 33a, 33b and the drive electrodes 34a, 34b (see FIGS. 2 and 3) formed on the pair of drive vibrating arms 22a and 22b of the vibrating gyro device 1. The detection circuit provided in the IC chip 90 amplifies a detection signal produced by each of the detection electrodes 36a, 36b and the detection electrodes 37a, 37b formed on the pair of detection vibrating arms 23a and 23b of the vibrating gyro device 1 to produce an amplified signal and detects a rotational angular velocity applied to the gyro sensor 50 based on the amplified signals.

The IC chip 90 is glued and fixed onto the die pad 65 provided on the recess bottom portion of the recess of the package 60 with a die attaching material 99 (wax material, for example). In this embodiment, the IC chip 90 is electrically connected to the package 60 in a wire bonding process. That is, the plurality of electrode pads provided on the IC chip 90 are connected to the corresponding IC connection terminals 66 in the package 60 with bonding wires 49.

The vibrating gyro device 1 is bonded to the relay substrate 80, which is located above the IC chip 90, in the recess of the package 60.

The relay substrate 80 is a wiring substrate that not only supports the vibrating gyro device 1 elastically to a predetermined extent without formation of any complicated support structure for supporting the vibrating gyro device 1 in the recess of the package 60 but also relays electric connection between the vibrating gyro device 1 and the package 60. The relay substrate 80 in this embodiment includes an insulating substrate having an opening (device hole) 82 provided in an area facing the base 21, where a support of the vibrating gyro device 1 is formed, a plurality of electrode lead wires 85 provided on one principal surface of the substrate, and connection electrodes 86 electrically connected to the corresponding electrode lead wires 85, for example, with intralayer wiring lines in the substrate. Each of the plurality of electrode lead wires 85 has one end disposed on the substrate and the other end extending toward the center of the opening 82 of the substrate and overhung above the opening 82.

The portion of each of the electrode lead wires 85 that is overhung above the opening 82 is formed by bending the electrode lead wire obliquely upward (toward lid 70) once at a point somewhere middle of the electrode lead wire extending from the substrate toward the center of the opening 82 and then bending the electrode lead wire again horizontally toward the center of the opening 82. The other end (front end) of each of the electrode lead wires 85 is disposed in a position of an corresponding exterior connection terminal (not shown) provided on the base 21 of the vibrating gyro device 1 so that the electrode lead wire 85 is electrically connected and mechanically bonded to the vibrating gyro device 1.

The relay substrate 80 can, for example, be a TAB (tape automated bonding) substrate for TAB mounting known in related art. Using a TAB substrate formed of a hoop-shaped insulating substrate on which a large number of relay substrates 80 are formed at equal intervals allows a series of steps from the step of manufacturing the relay substrates 80 to the step of mounting the vibrating gyro device 1 to be carried out continuously and efficiently.

It is noted that the relay substrate 80 is not limited to the TAB substrate described in this embodiment but can, for example, be formed of a lead frame.

The vibrating gyro device 1 can be bonded to the relay substrates 80 as follows: A bonding metal layer made, for example, of tin (Sn) or gold (Au) is formed in advance around each of the electrode lead wires 85 in a plating process or any other suitable process; a bonding metal layer is formed also on each of the exterior connection electrodes (not shown) provided on the base 21 of the vibrating gyro device 1; and each of the electrode lead wires 85 is positioned at the corresponding exterior connection electrode and bonded thereto by heating and pressurizing them in a metal eutectoid or metal bonding process. Other bonding methods using metal bumps, a conductive adhesive, and other bonding members (flip chip bonding) can be used.

The vibrating gyro device 1 bonded to the plurality of electrode lead wires 85 extending and overhung above the opening 82 of the relay substrates 80 is flexibly supported by the elastic electrode lead wires 85 having undergone a forming process. Therefore, when an impact acts on the gyro sensor 50, for example, when it is dropped, the electrode lead wires 85 absorb the impact and prevent the vibrating gyro device 1 from being damaged or otherwise defective, whereby the impact resistance of the gyro sensor 50 is advantageously improved.

The relay substrate 80 to which the vibrating gyro device 1 is bonded is bonded at a level above the IC chip 90 in the recess of the package 60. Specifically, the connection electrodes 86, which are not only provided on the surface of the relay substrate 80 different from the surface to which the vibrating gyro device 1 is bonded but also electrically connected to the plurality of electrode lead wires 85 of the relay substrates 80 that are connected to the vibrating gyro device 1, are positioned at the vibrating element connection terminals 67 provided on the step formed by the third layer substrate 63 of the package 60, and the connection electrodes 86 are bonded and fixed to the vibrating element connection terminals 67 with a bonding material 59, such as a conductive adhesive, for electrical connection.

This embodiment has been described with reference to the aspect in which the vibrating gyro device 1 is bonded into the package 60 via the relay substrate 80, but the relay substrate 80 is not necessarily used and any support structure that prevents vibration of the vibrating gyro device 1 from leaking or otherwise undetected may be used. For example, a support structure in which a support having connection terminals is provided and the vibrating gyro device 1 is bonded to and supported by the support may be formed in the recess of the package 60.

The lid 70 is disposed as a lid member on the package 60 into which the IC chip 90 and the vibrating gyro device 1 are bonded so that the lid 70 seals the opening of the package 60. The lid 70 can be made, for example, of a 42 alloy (iron alloy containing 42% of nickel), a kovar alloy (alloy made of iron, nickel, and cobalt), or any other suitable metal, a ceramic material, or a glass material. For example, a lid 70 made of a metal is bonded in a seam welding process to the package 60 via a seal ring 69 made of a kovar alloy or any other suitable alloy and formed into a rectangular frame-like shape in a die drawing process. The recessed space formed by the package 60 and the lid 70 allows the vibrating gyro device 1 to operate.

The recessed space can be sealed and encapsulated to form a reduced pressure space or an inert gas atmosphere.

As described above, the gyro sensor 50 as a sensor unit according to this embodiment, which includes the drive circuit that causes the drive vibrating arms to vibrate, the detection circuit that detects a detection signal produced in the detection vibrating arms, and the vibrating element capable of high-sensitive detection, can provide a sensor unit having stable characteristics.

Third Embodiment

Electronic Apparatus

Figure 8A:
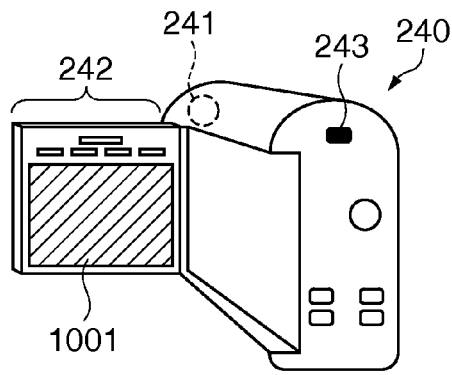
FIG. 8A is a perspective view of a digital video camcorder as an embodiment of an electronic apparatus.

FIG. 8A shows an application example in which the vibrating gyro device 1 or the gyro sensor 50 as a sensor unit including the vibrating gyro device 1 described in the above embodiments is incorporated in a digital video camcorder as an electronic apparatus. A digital video camcorder 240 includes an image receiving section 241, an operation section 242, an audio input section 243, and a display unit 1001. Further incorporating the vibrating gyro device 1 or the gyro sensor 50 as a sensor unit according to the corresponding one of the embodiments described above in the digital video camcorder 240 allows the digital video camcorder 240 to perform what is called a hand-shake correction function.

Figure 8B:
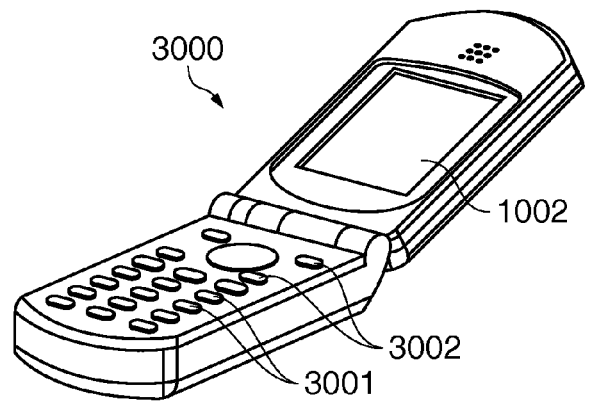
FIG. 8B is a perspective view of a mobile phone as another embodiment of an electronic apparatus.
Figure 8C:
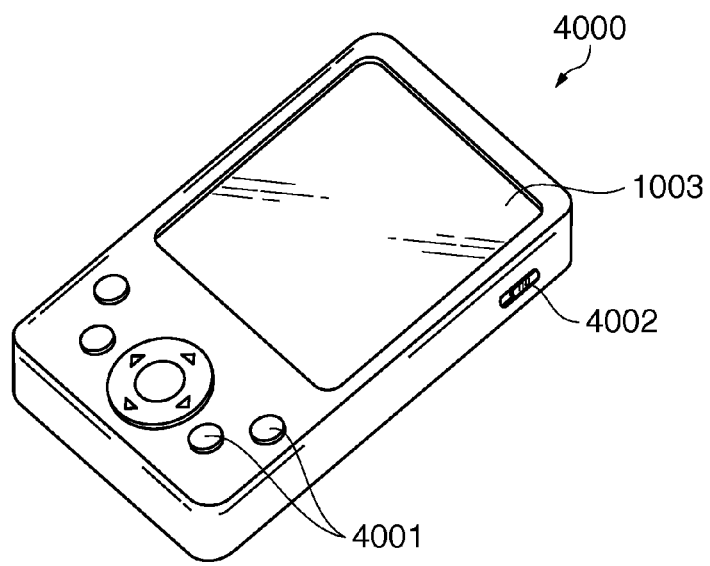
FIG. 8C is a perspective view of a personal digital assistant (PDA) as another embodiment of an electronic apparatus.

FIG. 8B shows an application example in which the vibrating gyro device 1 or the gyro sensor 50 is incorporated in a mobile phone as an electronic apparatus, and FIG. 8C shows an application example in which the vibrating gyro device 1 or the gyro sensor 50 is incorporated in a personal digital assistant (PDA) as an electronic apparatus.

First, a mobile phone 3000 shown in FIG. 8B includes a plurality of operation buttons 3001 and scroll buttons 3002 and a display unit 1002. When a user operates any of the scroll buttons 3002, a screen displayed on the display unit 1002 is scrolled.

A PDA 4000 shown in FIG. 8C includes a plurality of operation buttons 4001, a power switch 4002, and a display unit 1003. When a user operates the power switch 4002, an address book, a schedule card, and a variety of other pieces of information are displayed on the display unit 1003.

When the vibrating gyro device 1 or the gyro sensor 50 as a sensor unit according to the corresponding one of the embodiments described above is incorporated in the mobile phone 3000 and the PDA 4000, a variety of capabilities can be achieved. For example, when the mobile phone 3000 shown in FIG. 8B is provided with a camera capability (not shown), hand-shake correction can be performed as in the digital video camcorder 240 described above. When the mobile phone 3000 shown in FIG. 8B or the PDA 4000 shown in FIG. 8C is provided with a widely known global positioning system (GPS), incorporating the vibrating gyro device 1 or the gyro sensor 50 as a sensor unit according to the corresponding one of the embodiments described above in the mobile phone 3000 or the PDA 4000 allows the GPS to recognize the position and attitude of the mobile phone 3000 or the PDA 4000.

An electronic apparatus that can incorporate a sensor unit including the vibrating element according to the corresponding one of embodiments of the invention (gyro sensor) is not limited to the electronic apparatus shown in FIGS. 8A to 8C and may, for example, be a mobile computer, a car navigation apparatus, an electronic notebook, a desktop calculator, a workstation, a TV phone, a POS terminal, and a game console.

As described above, any of the electronic apparatus according to this embodiment, which includes the vibrating element capable of higher-sensitivity detection than in related art, can provide an electronic apparatus having stable characteristics.

The invention is not limited to the embodiments described above, and a variety of changes, improvements, and other modifications can be made to the embodiments described above. Variations will be described below. The same components as those in the embodiments described above have the same reference characters and no redundant description of the same components will be made.

Variations

FIGS. 9A to 9D are schematic plan views showing a variety of variation examples of the vibrating gyro device.

The first embodiment has been described with reference to the case where the vibrating gyro device 1 having the shape shown in FIG. 1 or 4 operates under the parameters f1, f2, and f3 that satisfy the expressions (1) to (3) described above, but the shape of the vibrating gyro device is not limited thereto. The above parameters that satisfy the expressions (1) to (3) described above can also be used with vibrating gyro devices having the shapes shown in FIGS. 9A to 9D.

In FIGS. 9A to 9D, A1 denotes the first vibrating arms and A2 denotes the second vibrating arms. Either A1 or A2 denotes the drive vibrating arms, and the other denotes the detection vibrating arms. A3 and A4 denote protruding portions that are, for example, the adjustment vibrating arms 25a and 25b described above having the intended capability of the protruding portions.

M1 denotes a support via which the vibrating gyro device is incorporated in the package 60, and a mount point M2 of the support M1 is glued to the package 60, for example, with an adhesive. Each support M1 is connected to the base 21 via the connection arm 24a or 24b. An vibrating gyro device having the supports M1 can be fixed to the package 60 by gluing the supports M1 to the third layer substrate 63 without via the relay substrates 80.

Each of the shapes in FIGS. 9A to 9D will be specifically described below.

Figure 9A:
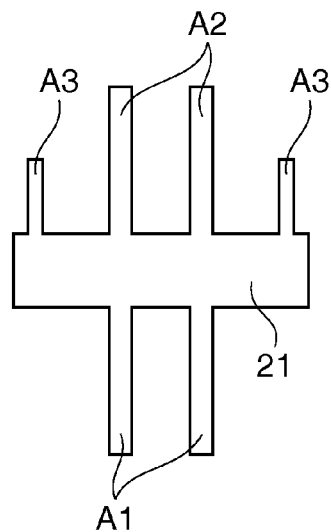
FIGS. 9A to 9D are schematic plan views showing variation examples of the vibrating gyro device.

An vibrating gyro device shown in FIG. 9A has a shape in which the base 21 extends in such a way that the connection arms 24a and 24b of the vibrating gyro device 1 are part of the base 21, and the protruding portions A3 extend from the opposites ends of the base 21 in parallel to each other along the Y axis in the direction in which the second vibrating arms A2 extend.

Figure 9B:
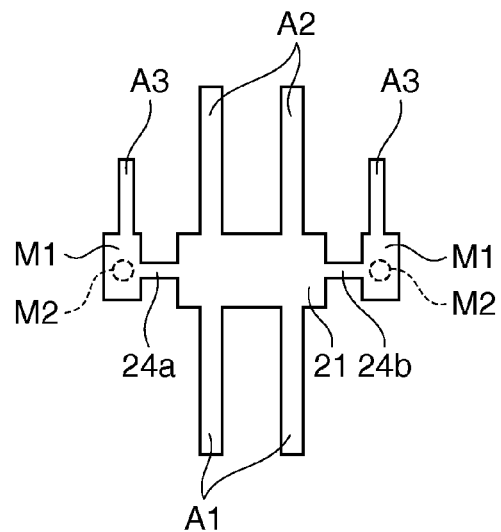

An vibrating gyro device shown in FIG. 9B has a shape in which the support M1 is provided at the front end of each of the connection arms 24a and 24b of the vibrating gyro device 1, and the protruding portions A3 extend from the supports M1 in parallel to each other along the Y axis in the direction in which the second vibrating arms A2 extend.

Figure 9C:
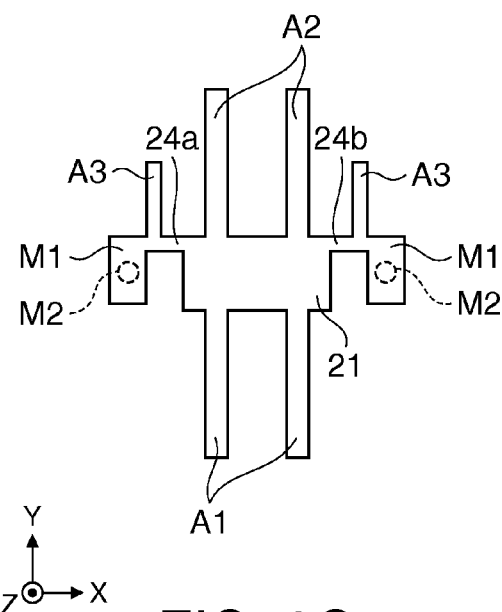

An vibrating gyro device shown in FIG. 9C has a shape in which the positions of the connection arms 24a and 24b of the vibrating gyro device shown in FIG. 9B are shifted in the Y-axis direction to the +Y-axis-side end of the base 21, and the protruding portions A3 extend from the connection arms 24a and 24b.

Figure 9D:
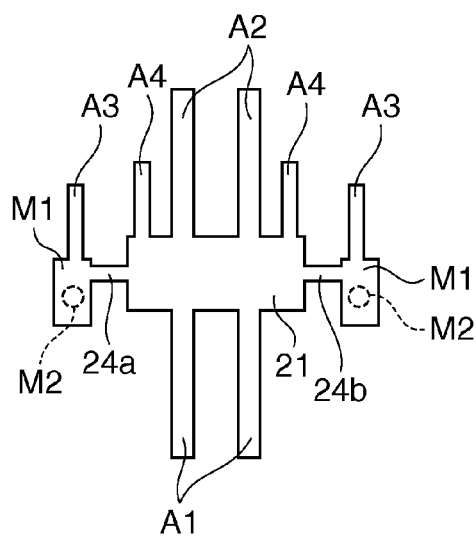

An vibrating gyro device shown in FIG. 9D has a shape in which the base 21 of the vibrating gyro device shown in FIG. 9B is elongated in the ±X direction, and the protruding portions A4 extend in parallel to each other along the Y axis from opposite end portions of the elongated base 21 in the direction in which the second vibrating arms A2 extend. Further, the supports M1 and the mount points M2 are shifted in the −Y direction.

In the vibrating gyro device having any of the shapes shown in FIGS. 9A to 9D, let f1 be the frequency of out-of-plane natural vibration of the first vibrating arms A1, f2 be the frequency of out-of-plane natural vibration of the second vibrating arms A2, and f3 be the frequency of out-of-plane natural vibration of the protruding portions A3 and A4. The frequencies f1 and f2 can be set in the same manner as described above by using the expressions (1) to (3). Further, the drive vibrating arms and the detection vibrating arms can be the first vibrating arms A1 and the second vibrating arms A2 respectively or vice versa, that is, arbitrarily set. The frequencies f3 of out-of-plane natural vibration of the protruding portions A3 and A4 may differ from each other.

As described above, the vibrating gyro devices according to the variations shown in FIGS. 9A to 9D can provide vibrating gyro devices having high detection sensitivity by setting the frequencies f1 and f2 in the same manner as described above by using the expressions (1) to (3) even in the following cases: when the connection arms 24a and 24b are not provided but the base 21 has the protruding portions A3; when the base 21 further has the supports M1 connected to the connection arms 24a and 24b; when the base 21 further has the protrusions A4; and when the protruding portions A3 extend from the supports M1 or the connection arms.

Other Variations

A variety of changes can be made to the invention to the extent that they do not depart from the substance of the invention.

For example, each of the above embodiments and variations has been described with reference to the case where the vibrating gyro device in the form of an vibrating element is made of quarts, but the vibrating gyro device can alternatively be made of a piezoelectric material other than quartz. For example, the following materials can be used: an oxide substrate made, for example, of an aluminum nitride (AlN), a lithium niobate (LiNbO$_3$), a lithium tantalate (LiTaO$_3$), lead zirconate titanate (PZT), lithium tetraborate (Li$_2$B$_4$O$_7$), or Langasite (La$_3$Ga$_5$SiO$_{14}$); a layered piezoelectric substrate formed by layering piezoelectric materials, such as an aluminum nitride and tantalum pentoxide (Ta$_2$O$_5$), on a glass substrate; and a piezoelectric ceramic.

The vibrating element can alternatively be made of a material other than a piezoelectric material. For example, the vibrating element can be made of a silicon semiconductor material.

Further, how to cause an vibrating element to vibrate (how to drive vibrating element) is not limited to a piezoelectric-based driving method. An vibrating element driven based on an electrostatic drive method using an electrostatic force, a Lorentz drive method using a magnetic force, and other methods as well as a piezoelectric drive method using a piezoelectric substrate can be configured according to the invention and provide advantageous effects thereof.

The entire disclosure of Japanese Patent Application No: 2012-76470, filed Mar. 29, 2012 is expressly incorporated by reference herein.

What is claimed is:

1. A vibrating element comprising:
a vibrating body having a base, a first vibrating arm extending from one end of the base, and a second vibrating arm extending from the other end of the base that faces away from the one end; and
a protruding portion extending from the vibrating body along the direction in which the second vibrating arm extends,
wherein one of the first vibrating arm and the second vibrating arm is a drive vibrating arm, and the other is a detection vibrating arm,
the drive vibrating arm is driven to make bending vibration in a predetermined plane, and
the following expressions (1) and (2) are satisfied:

$$f3 > f2 \quad (1)$$

$$0.964 \times (1 - 0.321^{(1+L/t)}) \leq f2/f1 \leq 0.995 \quad (2)$$

where t represents the thickness of the base,
L represents the length of the base in the direction in which the second vibrating arm extends,
f1 represents the frequency of natural vibration of the first vibrating arm in a direction that intersects the predetermined plane,
f2 represents the frequency of natural vibration of the second vibrating arm in a direction that intersects the predetermined plane, and
f3 represents the frequency of natural vibration of the protruding portion in a direction that intersects the predetermined plane.

2. The vibrating element according to claim 1,
wherein the following expression (3) is satisfied:

$$f2/f1 = 0.976 \times (1 - 0.237^{(1+L/t)}) \quad (3).$$

3. The vibrating element according to claim 1,
wherein the vibrating body further has a support that supports the base and a connection arm that connects the base and the support to each other, and
the protruding portion extends from the support or the connection arm along the direction in which the second vibrating arm extends.

4. The vibrating element according to claim 2,
wherein the vibrating body further has a support that supports the base and a connection arm that connects the base and the support to each other, and
the protruding portion extends from the support or the connection arm along the direction in which the second vibrating arm extends.

5. A sensor unit comprising:
the vibrating element according to claim 1; and
an electronic part including a drive circuit that causes the drive vibrating arm to vibrate and a detection circuit that detects a detection signal produced in the detection vibrating arm.

6. A sensor unit comprising:
the vibrating element according to claim 2; and
an electronic part including a drive circuit that causes the drive vibrating arm to vibrate and a detection circuit that detects a detection signal produced in the detection vibrating arm.

7. A sensor unit comprising:
the vibrating element according to claim 3; and
an electronic part including a drive circuit that causes the drive vibrating arm to vibrate and a detection circuit that detects a detection signal produced in the detection vibrating arm.

8. A sensor unit comprising:
the vibrating element according to claim 4; and
an electronic part including a drive circuit that causes the drive vibrating arm to vibrate and a detection circuit that detects a detection signal produced in the detection vibrating arm.

9. An electronic apparatus comprising the vibrating element according to claim 1.

10. An electronic apparatus comprising the vibrating element according to claim 2.

11. An electronic apparatus comprising the vibrating element according to claim 3.

12. An electronic apparatus comprising the vibrating element according to claim 4.

* * * * *